(12) United States Patent
Gandhi et al.

(10) Patent No.: US 10,692,733 B2
(45) Date of Patent: Jun. 23, 2020

(54) UNIFORM BACK SIDE EXPOSURE OF THROUGH-SILICON VIAS

(71) Applicant: Micron Technology, Inc., Boise, ID (US)

(72) Inventors: Jaspreet S. Gandhi, Boise, ID (US); Wayne H. Huang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/430,814

(22) Filed: Jun. 4, 2019

(65) Prior Publication Data
US 2019/0304799 A1    Oct. 3, 2019

Related U.S. Application Data

(60) Continuation of application No. 15/729,391, filed on Oct. 10, 2017, now Pat. No. 10,410,879, which is a division of application No. 14/608,751, filed on Jan. 29, 2015, now Pat. No. 9,818,622.

(51) Int. Cl.
*H01L 21/321* (2006.01)
*H01L 21/768* (2006.01)

(52) U.S. Cl.
CPC ...... *H01L 21/3212* (2013.01); *H01L 21/7684* (2013.01); *H01L 21/76898* (2013.01)

(58) Field of Classification Search
CPC . H01L 23/481; H01L 21/288; H01L 21/3212; H01L 21/7684; H01L 21/76898
USPC ................... 257/741, 774; 438/667
See application file for complete search history.

(56) References Cited

U.S. PATENT DOCUMENTS

| | | | |
|---|---|---|---|
| 9,818,622 B2 | 11/2017 | Gandhi et al. | |
| 2011/0095436 A1 | 4/2011 | Chen et al. | |
| 2011/0233785 A1 | 9/2011 | Koester et al. | |
| 2012/0083116 A1 | 4/2012 | Yang et al. | |
| 2014/0008815 A1* | 1/2014 | Park | H01L 21/76898 257/774 |
| 2014/0183740 A1* | 7/2014 | Li | H01L 21/76898 257/751 |
| 2015/0348872 A1 | 12/2015 | Kuo et al. | |
| 2015/0364400 A1* | 12/2015 | Dando | H01L 23/481 257/774 |

* cited by examiner

*Primary Examiner* — Tong-Ho Kim
(74) *Attorney, Agent, or Firm* — Perkins Coie LLP

(57) ABSTRACT

Systems and methods for uniform back side exposure of through-silicon vias (TSVs) are disclosed. In one embodiment, a semiconductor device comprises a substrate having a front side with circuit elements formed thereon, and a back side opposite the front side. A TSV extends between the front side and the back side of the substrate, and a dummy feature is disposed over the back side of the substrate, the dummy feature laterally spaced apart from the TSV and substantially coplanar with the TSV. In another embodiment, a semiconductor device comprises a substrate having a TSV formed therethrough, with a control material disposed over the back side of the substrate, the TSV substantially coplanar with the control material.

12 Claims, 9 Drawing Sheets

UNIFORM BACK SIDE EXPOSURE OF THROUGH-SILICON VIAS

CROSS-REFERENCE TO RELATED APPLICATION

This application is a continuation of U.S. patent application Ser. No. 15/729,391, filed Oct. 10, 2017, which is a divisional of U.S. patent application Ser. No. 14/608,751, filed Jan. 29, 2015, each of which are incorporated herein by reference in their entirety.

TECHNICAL FIELD

The disclosed embodiments relate to semiconductor devices and more particularly to systems and methods for planarizing back sides thereof to expose through-silicon vias.

BACKGROUND

In semiconductor processing, through-silicon vias (TSV) are often used to provide electrical connection between adjacent semiconductor dies. Fabrication of TSVs involves etching a deep hole into a semiconductor wafer or substrate and filling the resulting hole with a conductive fill such as copper. The wafer is then thinned from its back side until the conductive fill is exposed, and back side bond pads are then formed over the exposed TSV for electrical contact. Typically, the wafer is thinned using a chemical mechanical planarization (CMP) process.

One challenge of using back side CMP processes to expose TSVs is that they often fail to achieve the requisite planarity. For example, CMP processes may underpolish areas where TSVs are located, but overpolish other areas. In either case, this can introduce undesired topography, and can deleteriously affect performance of the TSVs. For example, underpolishing may leave residual material that interferes with the electrical contact of the TSVs. Further, varying topography of the back side of a wafer can lead to further problems for inspection and metrology. Accordingly, there remains a need to develop practical methods to improve back side exposure of TSVs.

DETAILED DESCRIPTION

Specific details of several embodiments of dummy features and related structures, or an additional control material to modulate back side CMP processes, and associated systems and methods, are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-5.

As used herein, the terms "vertical," "lateral," "upper" and "lower" can refer to relative directions or positions of features in the semiconductor structures in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
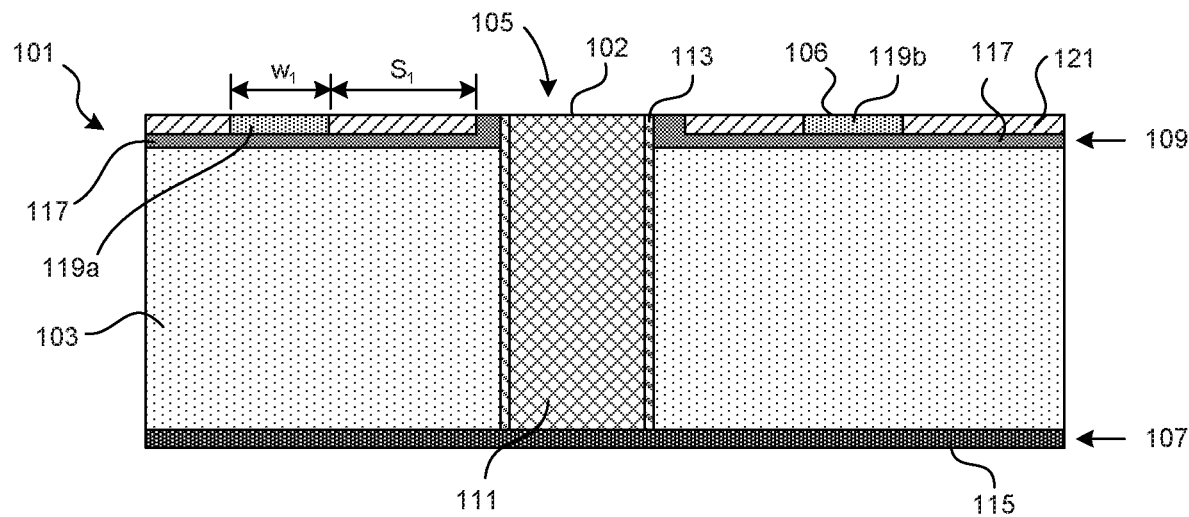
FIG. 1A is a cross-sectional view.
Figure 1B:
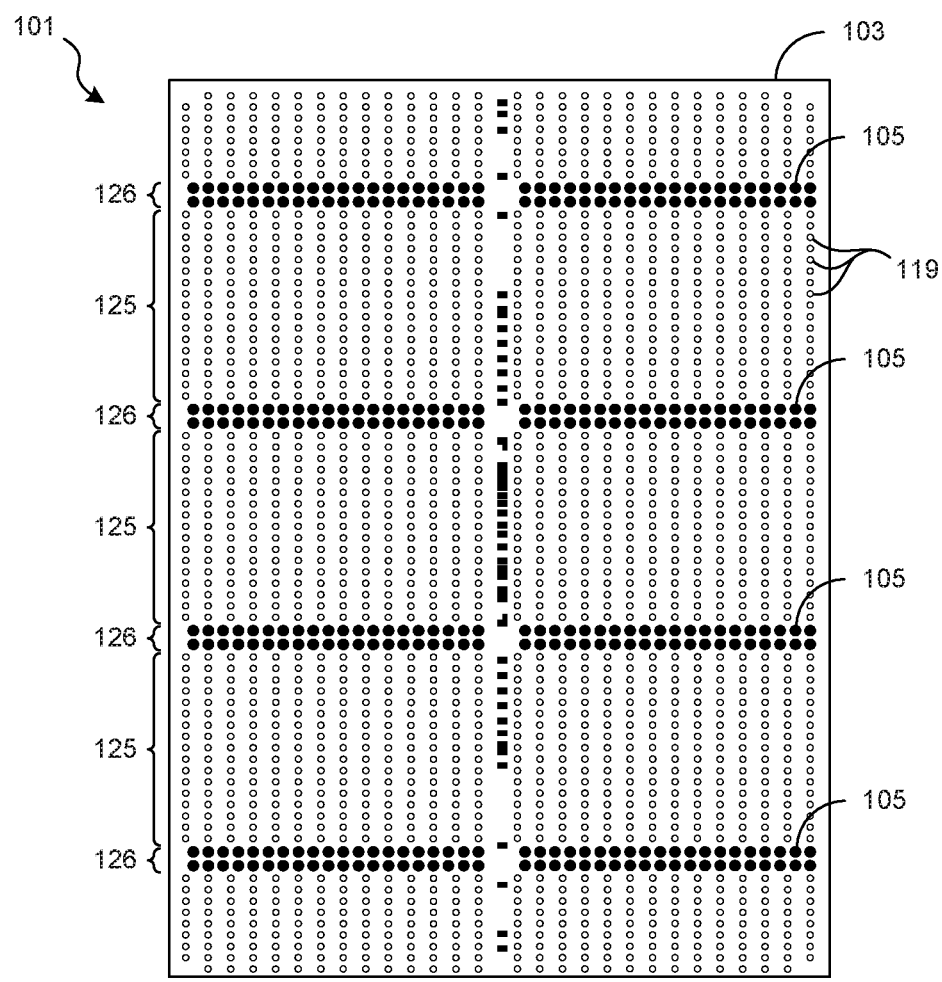
FIG. 1B is a bottom plan view of a semiconductor device in accordance with embodiments of the present technology.

FIG. 1A is a cross-sectional view, and FIG. 1B is a bottom plan view of a semiconductor device 101 in accordance with embodiments of the present technology. Referring first to FIG. 1A, the semiconductor device 101 includes a substrate 103 having a front side 107, a back side 109 opposite the front side 107, and a through-silicon via (TSV) 105 extending at least between the front side 107 and the back side 109. The substrate 103 can include, e.g., a silicon substrate (e.g., a silicon die) and a plurality of circuit elements 115 (e.g., wires, traces, interconnects, transistors, etc.) in or on the front side 107. For example, metal traces can be formed on the substrate 103, while integrated circuit elements can be located in the substrate beneath the metal traces. The TSV 105 includes a conductive fill 111 and a barrier material 113 disposed between the conductive fill 111 and the surrounding substrate 103. The semiconductor device 101 further includes a first dielectric material 117 disposed over the back side 109, first and second dummy features 119a and 119b (collectively "dummy features 119") positioned over the first dielectric material 117 and spaced laterally apart from the TSV 105, and a second dielectric material 121 disposed over the first dielectric material 117 and laterally surrounding the dummy features 119. In at least some embodiments, the dummy features 119 are not electrically connected to the circuit elements 115 and/or any other active components of the device 101.

As shown, the TSV 105 has a first exposed surface 102, and the dummy features 119 each have a second exposed surface 106 that is substantially coplanar with the first surfaces 102. The outer surfaces of second dielectric material 121 can also be coplanar with the first and second exposed surfaces 102 and 106. The first and second exposed surfaces 102 and 106 of the TSVs 105 and dummy features 119, and the surface of second dielectric material 121 can be formed by, for example, a chemical-mechanical planarization (CMP) process. As noted above, one challenge with traditional CMP processing is that it can remove certain dielectric materials more quickly than certain metallic materials, which can cause overpolishing of the dielectric materials. In general, the front side of a substrate may be less prone to overpolish since metal is often more evenly distributed across the front side of a substrate. In the case of back side CMP, however, the disparity in material removal rates can sometimes cause a significant amount of overpolish in the areas of the substrate that do not have TSVs. In particular, this is because TSVs are usually confined to discrete regions on the substrate to minimize the amount of space that they occupy in the substrate. In the areas not occupied by TSVs, overpolishing can cause dishing effects and other types of undesirable topography.

Dummy features configured in accordance with the various embodiments of the present technology, however, can achieve improved back side planarity in back side CMP processes. The dummy features 119 are made from a "control material" that has a different removal rate in CMP processing than the second dielectric material 121. The dummy features 119, for example, can be made from a metal or other material having a removal rate at least similar to the fill material 111 of the TSV 105. In many applications, the control material that forms the dummy features 119 has a lower removal rate than the second dielectric material for CMP processes used to planarize the back side of the device 101 to expose the TSVs 105. The dummy features 119 can be positioned on the back side 109 in various locations not occupied by the TSVs 105 (e.g., spaced laterally apart from the TSVs 105). Referring to FIG. 1B, for example, the dummy features 119 can be disposed in first regions 125 that do not contain any TSVs 105 or have a low density of TSVs 105, and the TSVs 105 can be located primarily, or exclusively, in second regions 126. Since the dummy features 119 are made of a metallic material, they reduce the material removal rate in the first regions 125 during CMP and thereby prevent attendant dishing and other effects of overpolishing. In general, the number and/or density of dummy structures 119 can be selected to achieve a relatively smooth surface at the back side with suitable uniformity. In at least some embodiments, the dummy features 119 can also be interspersed throughout second regions 123 that contain TSVs 105. Additionally, individual dummy features 119 can be arrayed in an alternating pattern with the TSVs 105. For example, in one embodiment two dummy features may be positioned between a pair of TSVs.

Individual dummy features can also be spaced apart from one another at regular intervals and/or have certain dimensions configured to improve back side planarity. Referring back to FIG. 1A, in at least some embodiments, the dummy structures can be spaced apart from one another and/or the TSV 105 by a spacing $S_1$. In some embodiments, the dummy features 119 can be spaced apart from the TSV 105 by at least 10 microns, at least 20 microns, at least 30 microns, or more. In these and other embodiments, the individual dummy structures can have a cross-sectional dimension, such as a width $w_1$, so that the spacing $S_1$ and the width $w_1$ provide a desired planarity across the back side 109. For example, with all else being equal, increasing the width $w_1$ may slow the rate of CMP material removal, while decreasing the width $w_1$ may increase the rate of material removal. In some embodiments, the dummy features 119 can have a width that is approximately equal to a width of the TSV 105. In other embodiments, the dummy features 119 can have a width that is less or more than the width of the TSV 105. In still other embodiments, the dummy features 119 can have varying widths that are greater and/or less than the width of the TSV 105 depending on the location across the wafer. In some embodiments, the dummy features 119 can have a width of between 1 and 10 microns. Further, the width $w_1$ and the spacing $S_1$ can be selected together to define a suitable pitch; however, the dummy features 119 need not be distributed according to a uniform pitch or a uniform array to provide improved planarity. Rather, the dummy features could be configured in irregular or varying arrangements. Additionally, the cross-sectional shape of the dummy features 119 can vary, for example circular, regular polygonal, irregular, etc. The dummy features 119 can also take the form of a line or other elongated structure, rather than the pillar-like shape shown in FIG. 1A.

Another advantage of the dummy features 119 is that, unlike the TSV 105, they do not require a via through hole. As such, they do not interfere with the function or layout of the circuit elements 115 on the front side 107. In at least some embodiments, the number and/or arrangement of the dummy features 119 can be selected to counteract stress forces that may otherwise cause the substrate 103 to bend or warp. Additionally, the number and/or arrangement of dummy features can be selected to facilitate heat conduction away from the device 101. For example, the dummy structures can be configured to transfer heat produced by the active components of the die to an overlying bond pad, which in turn can transfer heat to a heat sink, a die in a stacked die assembly, a thermally conductive casing enclosing such a stacked die assembly or another structure.

Figure 2A:
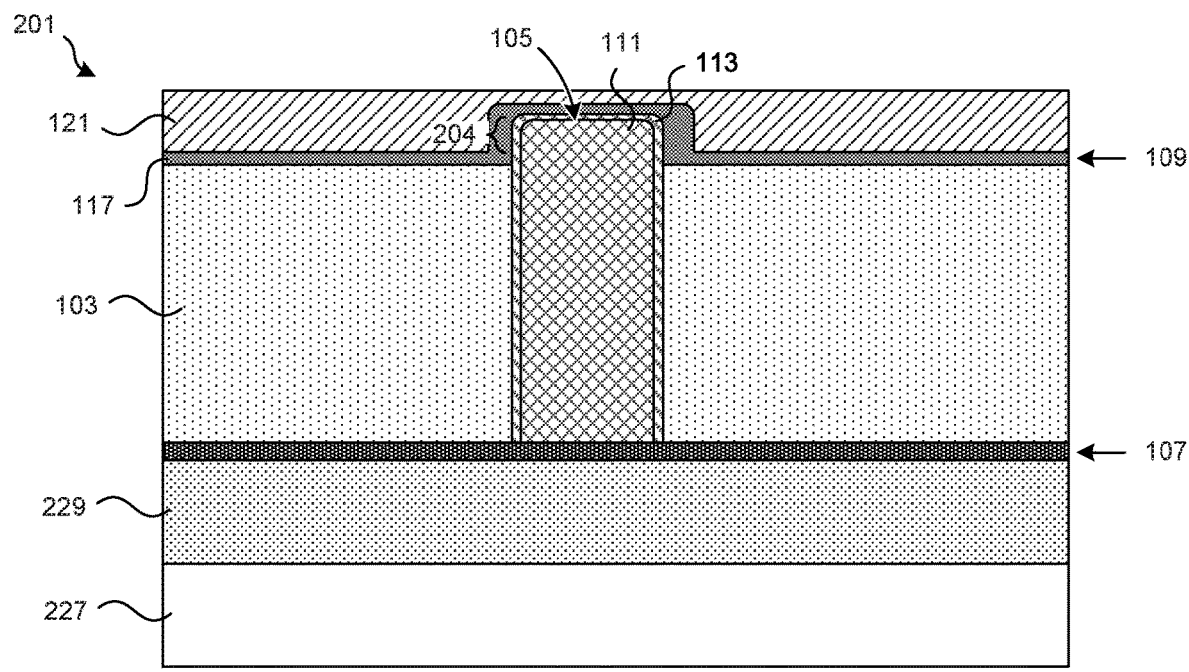
FIGS. 2A-2G are cross-sectional views illustrating a semiconductor device at various stages of manufacture in a method of exposing the back side of a TSV in accordance with embodiments of the present technology.

FIGS. 2A-2G are cross-sectional views illustrating a semiconductor device 201 at various stages of manufacture in a method of exposing the back side of a TSV in accordance with embodiments of the present technology. With reference to FIG. 2A, the semiconductor device 201 includes the TSV 105 formed in the substrate, the first dielectric material 117 (e.g., silicon nitride) formed over the TSV 105 and the back side 109, and the second dielectric material 121 formed over the first dielectric material 117. The TSV 105 can be formed by depositing (e.g., electroplating or electroless plating) the barrier material and the conductive material in sequence within a through-hole etched into the substrate 103. In at least some instances, the TSV 105 can be formed after thinning the substrate 103 by, e.g., backgrinding at the back side 109. After thinning the substrate 103, a portion 204 of the TSV 105 may project beyond the substrate 103. In at least some embodiments, the second dielectric material 121 can include, a SiOx material, such as silicon dioxide, tetraethyl orthosilicate (TEOS), etc. In the illustrated embodiment of FIG. 2A, the substrate 103 is attached to a carrier 227 via an adhesive layer 229. The carrier 227 can be used to provide additional stability throughout intermediate back side processing steps, and can later be removed along with the adhesive layer 229.

Figure 2B:
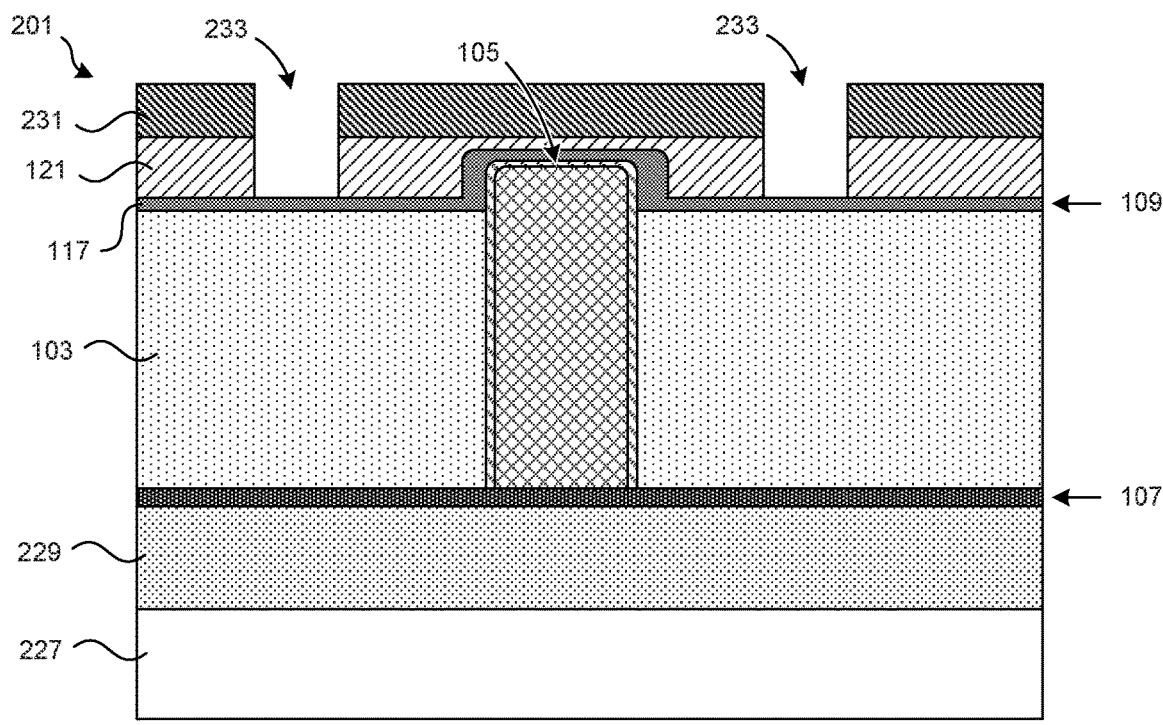

FIG. 2B shows the semiconductor device 201 after a photoresist layer 231 has been deposited over the second dielectric material 121. As shown, openings 233 have been etched into the second dielectric material 121 down to the first dielectric material 117. The openings 233 can be defined using photolithography and development of the photoresist, followed by wet or dry chemical etching, or other suitable material removal technique. The openings 233 can define the position, shape, and size of the dummy features. In some embodiments, the openings 233 can have a width of between about 1 micron and about 10 microns. In some embodiments, the openings 233 can have a width that is approximately equal to a width of the TSV 105. The shape of the openings 233 can take various forms, including circular, regular polygonal, irregular, etc. The openings 233 can also define a line or other elongated structure. In other embodiments, a titanium material can be deposited over the first dielectric material 117 but below the second dielectric material 121, and the etching to define the openings 233 can extend to the first dielectric material 117.

Figure 2C:
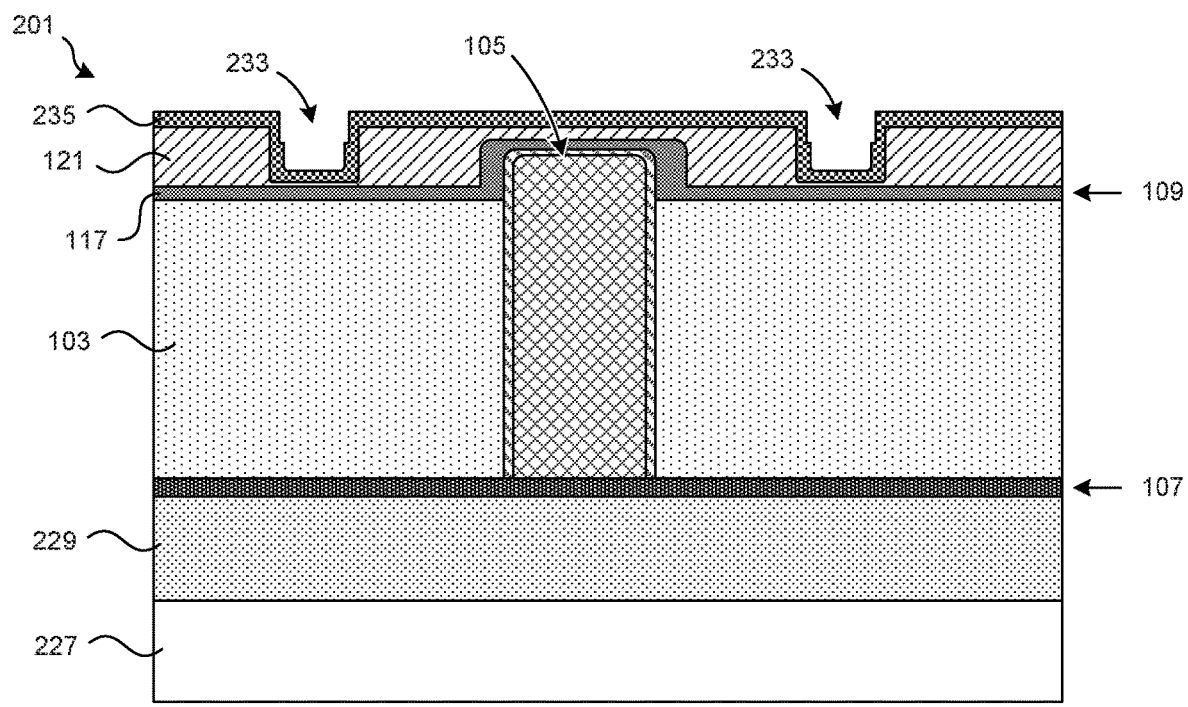
Figure 2D:
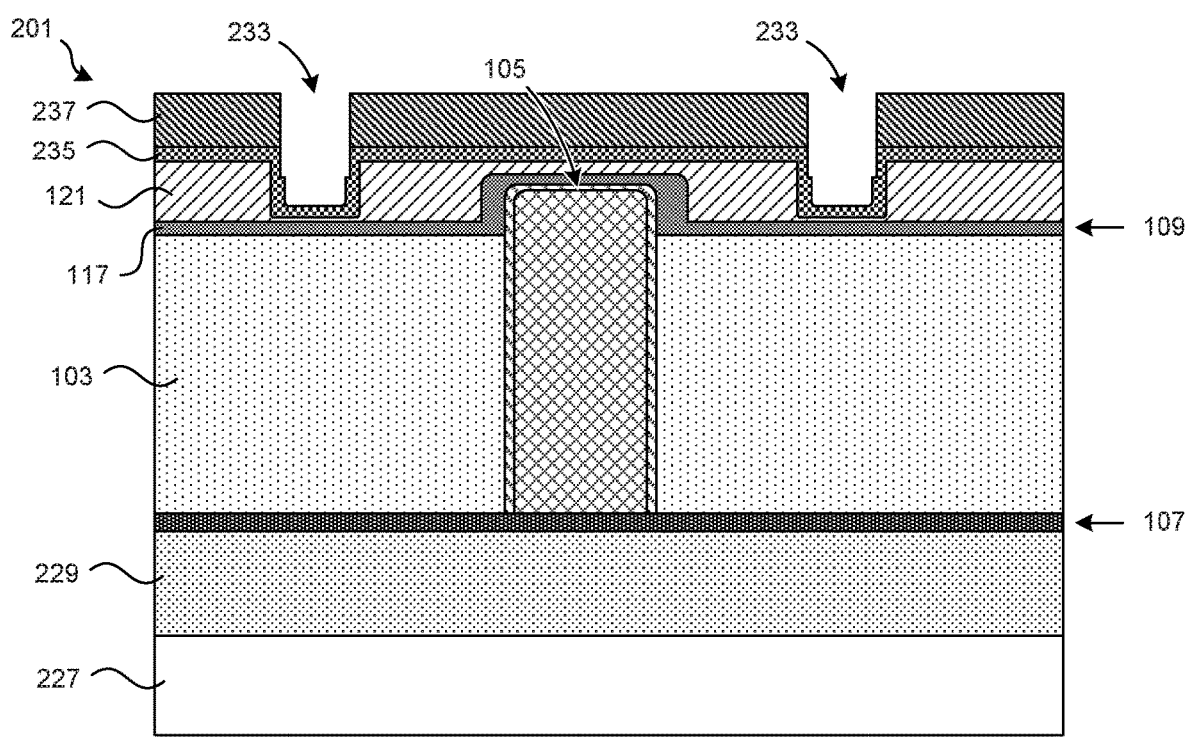

FIG. 2C shows the semiconductor device 201 after the photoresist layer 231 has been stripped and a seed material 235 has been deposited over the back side 109. The seed material 235 can be selected to allow plating of a metal thereon to form the dummy features within the openings 233. In some embodiments, the seed material 235 can be a copper or other metallic material deposited via sputtering, atomic material deposition, chemical vapor deposition, or other suitable technique. The seed material 235 can have a thickness of between about 5 and about 100 nm. FIG. 2D shows the semiconductor device 201 after a second photoresist layer 237 has been deposited over the seed material 235, and openings 233 have been defined in the second photoresist layer 237. The openings 233 can be defined in the second photoresist layer 237 using photolithography and development of the photoresist, followed by wet or dry chemical etching, or other suitable material removal technique.

Figure 2E:
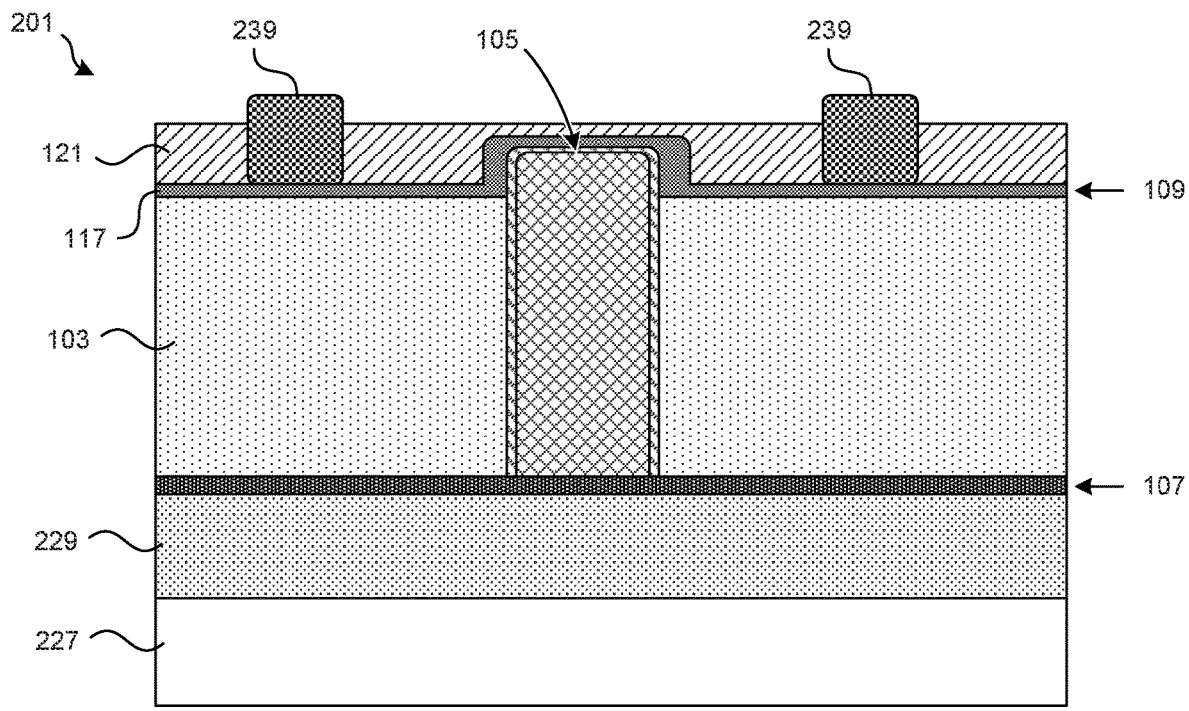
Figure 2F:
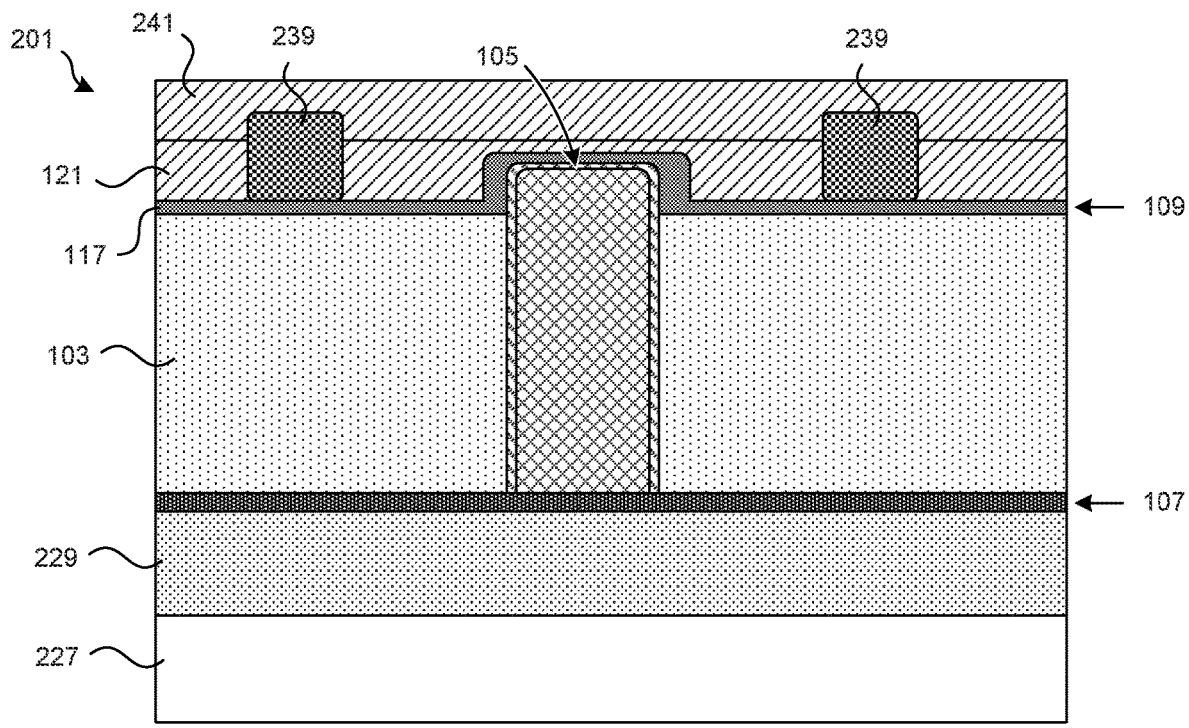

FIG. 2E shows the semiconductor device 201 after conductive deposits 239 have been formed in the openings 233 and the second photoresist layer 237 has been stripped. The conductive deposits 239 can be formed by electroplating or electroless plating. The conductive deposits 239 can include copper, for example, and in some embodiments may be the same material as the material of the conductive fill 111 of the TSV 105. The conductive deposits 239 can be plated into the openings 233 such that the height of the conductive deposits 239 extends beyond the second dielectric material 121. FIG. 2F illustrates the semiconductor device 201 after an additional layer 241 of dielectric material has been deposited over the back side. The additional layer 241 can cover the conductive deposits 239.

Figure 2G:
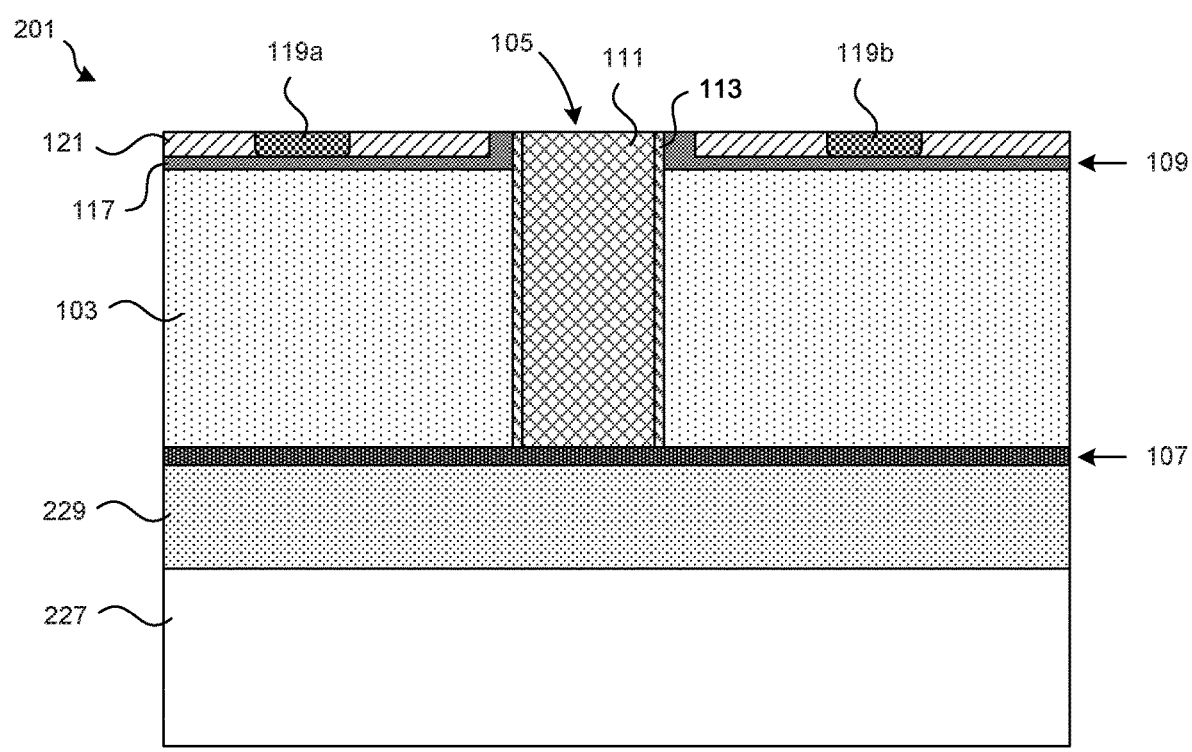

In FIG. 2G, the back side of the semiconductor device 201 has been planarized, for example by a CMP process. The CMP process can remove material from the back side 109, including a portion of the second dielectric material 121. The CMP process additionally removes a portion of the first dielectric material 117 and the second dielectric material 121 in the region over the TSV 105, to expose the surfaces of the TSV 105 and the dummy features 119 along the back side. The conductive deposits 239 and the TSV 105 are also reduced in height via the CMP process. After the CMP process, the second dielectric material 121, dummy features 119, and TSV 105 are all substantially coplanar on the back side. As noted above, the presence of the dummy features 119 during the CMP process improves planarity and reduces the risk of overpolish in the areas spaced apart from the TSV 105. Following planarization, a bond pad (not shown) can be formed over the TSV 105, and optionally dummy bond pads can also be formed over the dummy features 119.

Figure 3:
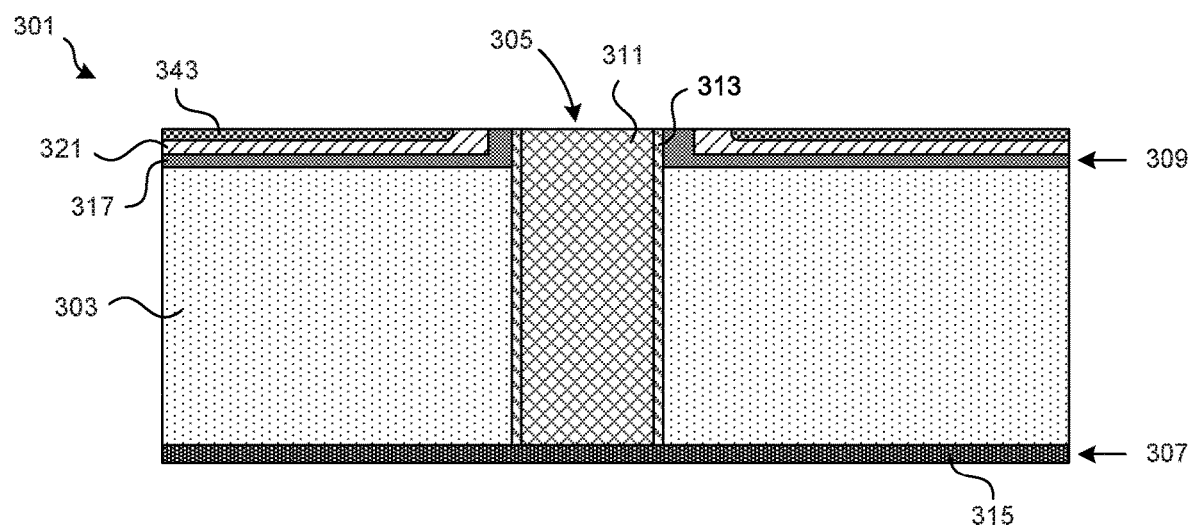
FIG. 3 is a cross-sectional view of another semiconductor device in accordance with embodiments of the present technology.

FIG. 3 is a cross-sectional view of another semiconductor device 301 in accordance with embodiments of the present technology. The semiconductor device 301 includes a substrate 303 having a through-silicon via (TSV) 305 extending between a front side 307 and a back side 309. The TSV 305 includes a conductive fill 311 and a barrier material 313 disposed between the conductive fill 311 and the surrounding substrate 303. A plurality of circuit elements 315 are formed in or on the front side 307, for example wires, interconnects, transistors, etc. The device 301 has a first dielectric material 317 disposed over the back side 309 and surrounding the portion of the TSV 305 that extends beyond the substrate 303, and a second dielectric material 321 disposed over the first dielectric material 317. The device 301 can also include a CMP control material 343 disposed over the second dielectric material 321. The CMP control material 343 can be, for example, titanium or other material that substantially slows the rate of CMP material removal. The control material 343, for example, can be a CMP stop material. The surface of the CMP control material 343 is substantially coplanar with the TSV 305, such that the back side of the semiconductor device 301 has a substantially planar surface.

This back surface can be planarized using a CMP process. As noted previously, planarization of the back side to expose the TSV 305 can cause overpolishing in areas adjacent to the TSV 305 that produces a dishing effect and introduces undesirable topography. By disposing a CMP control material 343 over the back side 109 and laterally spaced apart from the TSV 305, the CMP process can achieve improved planarity as compared to what would be achieved without the CMP control material 343. The CMP control material 343 effectively reduces the CMP material removal rate in adjacent regions, resulting in overall improved planarity. This approach does not interfere with the function or layout of the circuit elements 315 on the front side 307. The CMP control material 343 therefore provides the benefit of improved back side planarity without sacrificing available area on the front side of the substrate.

Figure 4A:
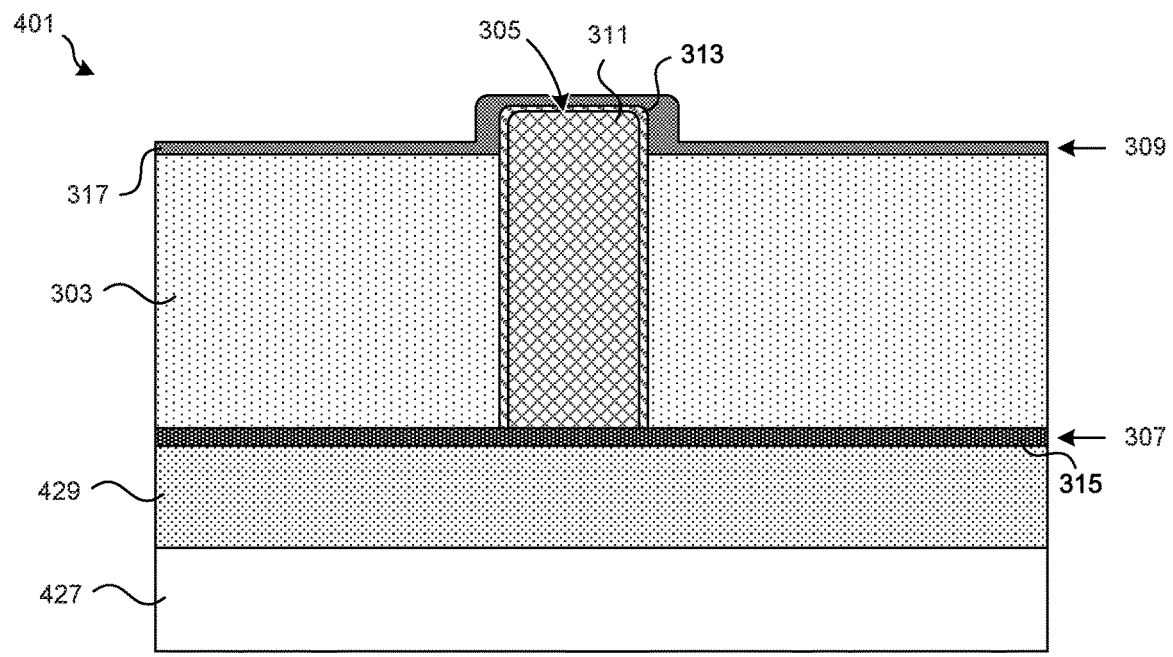
FIGS. 4A-4D are cross-sectional views illustrating a semiconductor device at various stages of manufacture in another method of exposing the back side of a TSV in accordance with embodiments of the present technology.

FIGS. 4A-4D are cross-sectional views illustrating a semiconductor device 401 at various stages of manufacture in another method of exposing the back side of a TSV in accordance with embodiments of the present technology. With reference to FIG. 4A, a semiconductor device 401 includes the substrate 303 with the TSV 305 extending between the front side 307 and the back side 309. The substrate 303 is attached to a carrier 427 via an adhesive layer 429. The carrier 427 can be used to provide additional stability throughout intermediate back side processing steps, and can later be removed along with the adhesive layer 429.

Figure 4B:
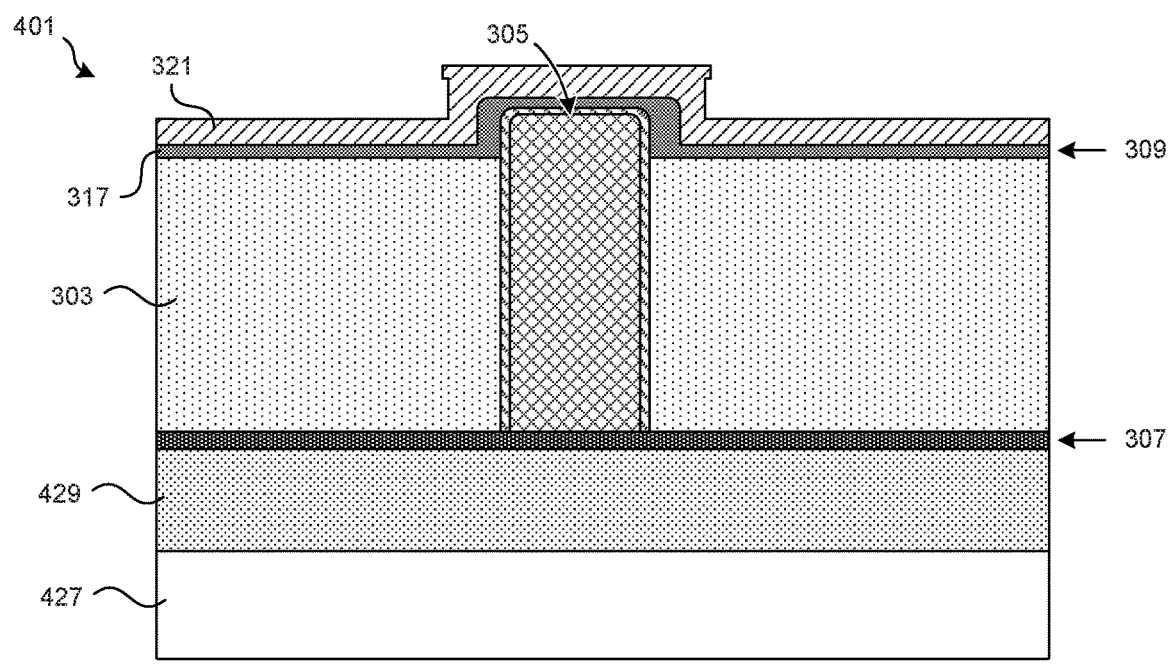

FIG. 4B illustrates the semiconductor device 401 after the second dielectric material 321 has been deposited over the first dielectric material 317. The second dielectric material 321 can be, for example, $SiO_x$ material such as silicon dioxide, tetraethyl orthosilicate (TEOS), etc. The second dielectric material 321 can be deposited at a thickness of between 0.5 and 5 microns, or approximately 2 microns in some embodiments.

Figure 4C:
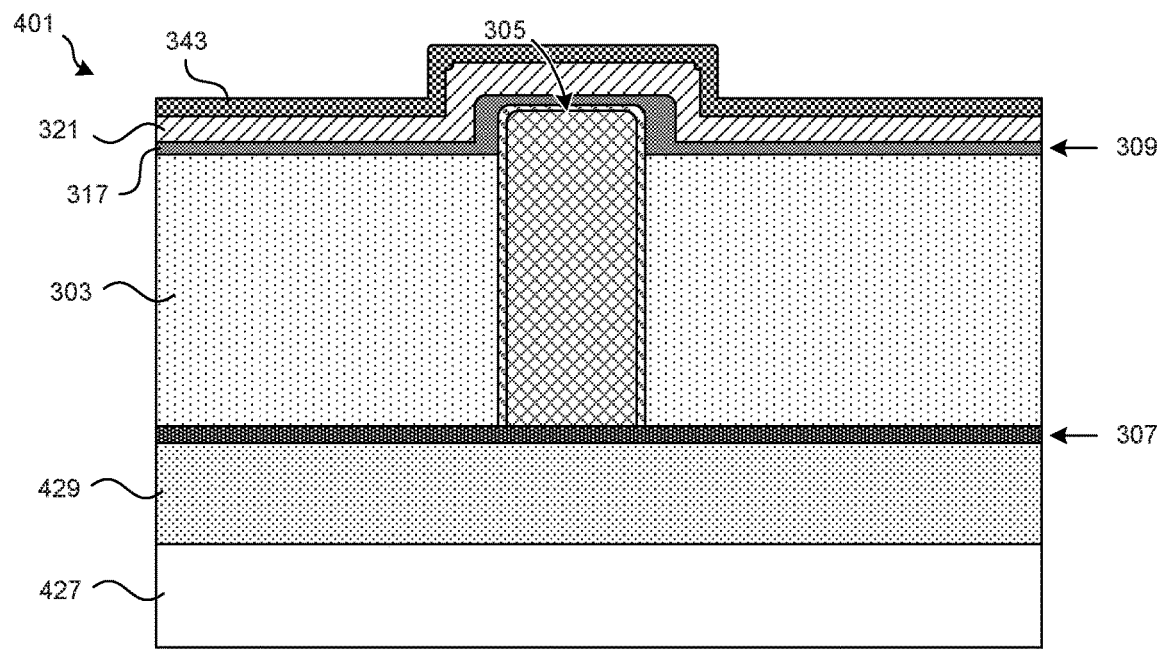

FIG. 4C illustrates the semiconductor device 401 after the CMP control material 343 has been deposited over the second dielectric material 321. The CMP control material 343 can be, for example, titanium or another material that significantly slows the material removal rate of a CMP process. The CMP control material 343 can have a thickness of between about 0.5 and 5 microns, or in some embodiments approximately 2 microns.

Figure 4D:
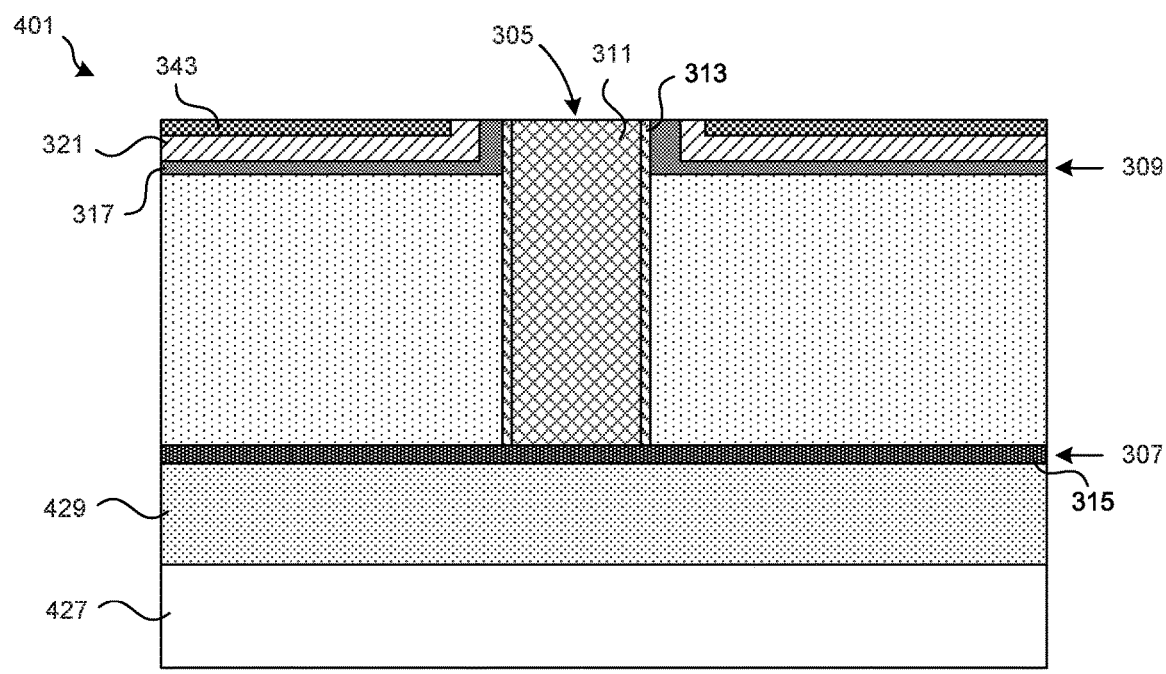

In FIG. 4D, the back side of the semiconductor device 401 has been planarized by CMP process. The CMP process can remove material from the back side, including portions of the CMP control material 343, the second dielectric material 321, and the first dielectric material 317 in the region over the TSV 305 to expose the TSV 305 to the back side. In the areas laterally spaced from the TSV 305, the CMP process stops before removing all of the CMP control material 343. After the CMP process, the CMP control material 343 and the TSV 305 are substantially coplanar on the back side. As noted above, the presence of the CMP control material 343 during the CMP process improves planarity and reduces the risk of overpolish in the areas spaced apart from the TSV 305.

Figure 5:
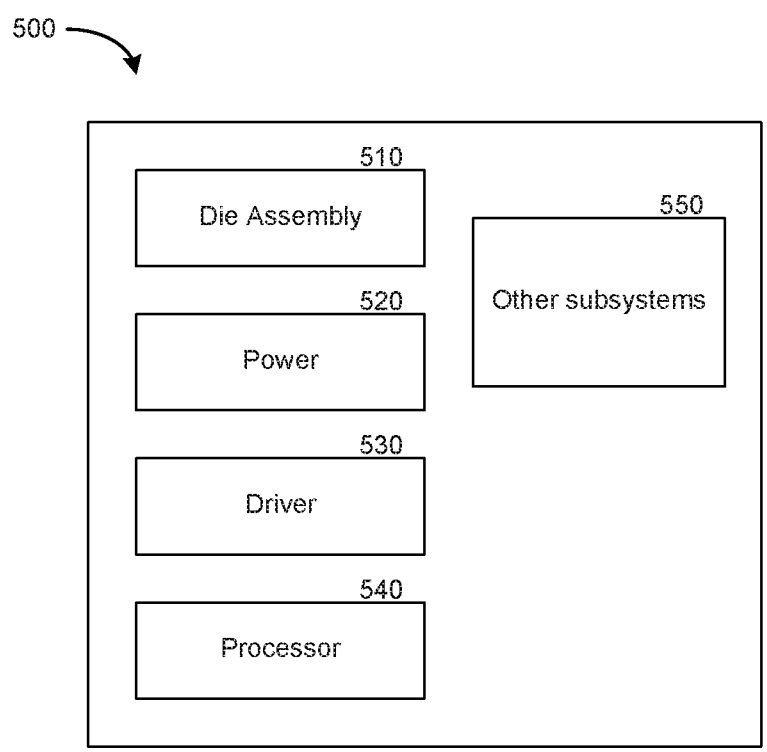
FIG. 5 is a schematic view of a system that includes a semiconductor device configured in accordance with embodiments of the present technology.

Any one of the semiconductor structures described above with reference to FIGS. 1A-4D can be incorporated into any of a myriad of larger and/or more complex systems, a representative example of which is system 500 shown schematically in FIG. 5. The system 500 can include a semiconductor device 510, a power source 520, a driver 530, a processor 540, and/or other subsystems or components 550. The semiconductor device 510 can include features generally similar to those of the semiconductor devices described above, and can therefore include dummy features or a CMP control material on the back side to improve planarity of a back side CMP process. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer-readable media.

From the foregoing, it will be appreciated that specific embodiments of the invention have been described herein for purposes of illustration, but that various modifications may be made without deviating from the disclosure. Certain aspects of the new technology described in the context of particular embodiments may also be combined or eliminated in other embodiments. For example, the process described above with respect to FIGS. 2A-2G can be combined with the process described with respect to FIGS. 4A-4D such that the semiconductor device includes both dummy features and a CMP control material. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device comprising:
    a substrate having a front side, a plurality of circuit elements proximate the front side, and a back side opposite the front side;
    a through-silicon via (TSV) extending at least between the front side and the back side;
    a chemical-mechanical planarization (CMP) control material disposed over the back side, the TSV substantially coplanar with the control material; and
    a dielectric material disposed between the CMP control material and the substrate, the dielectric material having a CMP removal rate that is greater than a CMP removal rate of the CMP control material.

2. The semiconductor device of claim 1 wherein the substrate comprises a memory circuit.

3. The semiconductor device of claim 1 wherein the CMP control material is metallic.

4. The semiconductor device of claim 1 wherein the CMP control material comprises titanium.

5. The semiconductor device of claim 1, wherein the CMP control material is configured to modify a material removal rate of a CMP process.

6. The semiconductor device of claim 1 wherein the CMP control material has a thickness between about 0.5 and about 5 microns.

7. The semiconductor device of claim 6 wherein the CMP control material has a thickness between about 2 microns and about 5 microns.

8. A method of manufacturing a semiconductor device, the method comprising:
    forming a through-silicon via (TSV) in a substrate, the TSV including a conductive material extending through the substrate and projecting beyond a back side of the substrate;
    forming a dielectric material over the back side and over the conductive material;
    forming a chemical-mechanical planarization (CMP) control material over the dielectric material, the CMP control material having a CMP removal rate that is lower than a CMP removal rate of the dielectric material.

9. The method of claim 8, further comprising planarizing the back side such that the CMP control material is substantially coplanar with the conductive material of the TSV.

10. The method of claim 9 wherein the planarizing comprises using a CMP process.

11. The method of claim 8 wherein forming the CMP control material comprises depositing titanium over the back side of the substrate.

12. The method of claim 8 wherein the CMP control material has a thickness of between about 0.5 and about 5 microns.

* * * * *